(12) United States Patent
Bai et al.

(10) Patent No.: US 10,930,184 B1
(45) Date of Patent: Feb. 23, 2021

(54) DISPLAY PANEL UNIFORMITY CALIBRATION SYSTEM

(71) Applicant: Facebook Technologies, LLC, Menlo Park, CA (US)

(72) Inventors: Nan Bai, Menlo Park, CA (US); Ahmad Byagowi, Fremont, CA (US); Kieran Tobias Levin, Union City, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/539,820

(22) Filed: Aug. 13, 2019

(51) Int. Cl.
*G09G 3/00* (2006.01)
*G01R 31/28* (2006.01)

(52) U.S. Cl.
CPC ........... *G09G 3/006* (2013.01); *G01R 31/282* (2013.01); *G09G 2320/0693* (2013.01)

(58) Field of Classification Search
CPC .............................. G09G 3/006; G01R 31/282
See application file for complete search history.

(56) References Cited

U.S. PATENT DOCUMENTS

| 2009/0199152 | A1* | 8/2009 | Sjostrom | G03F 7/70516 716/55 |
| 2015/0177367 | A1* | 6/2015 | Sebastian | G01S 7/493 356/5.09 |
| 2017/0140556 | A1* | 5/2017 | Safaee-Rad | G06T 11/001 |

* cited by examiner

*Primary Examiner* — Chun-Nan Lin
(74) *Attorney, Agent, or Firm* — FisherBroyles, LLP

(57) ABSTRACT

The disclosed computer-implemented method may include a display calibration apparatus. The display calibration apparatus may include a lens and an actively-cooled electromagnetic radiation detector configured to detect electromagnetic radiation emitted from various pixels of an electronic display panel under test. The electromagnetic radiation may travel through the lens prior to reaching the detector. The display calibration apparatus may also include a special-purpose computing device configured to: analyze the detected electromagnetic radiation from the pixels of the electronic display panel and generate calibration data for the electronic display panel using a specified calibration algorithm. As such, the electronic display panel may operate using the generated calibration data. Various other methods, systems, and computer-readable media are also disclosed.

20 Claims, 11 Drawing Sheets

DISPLAY PANEL UNIFORMITY CALIBRATION SYSTEM

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
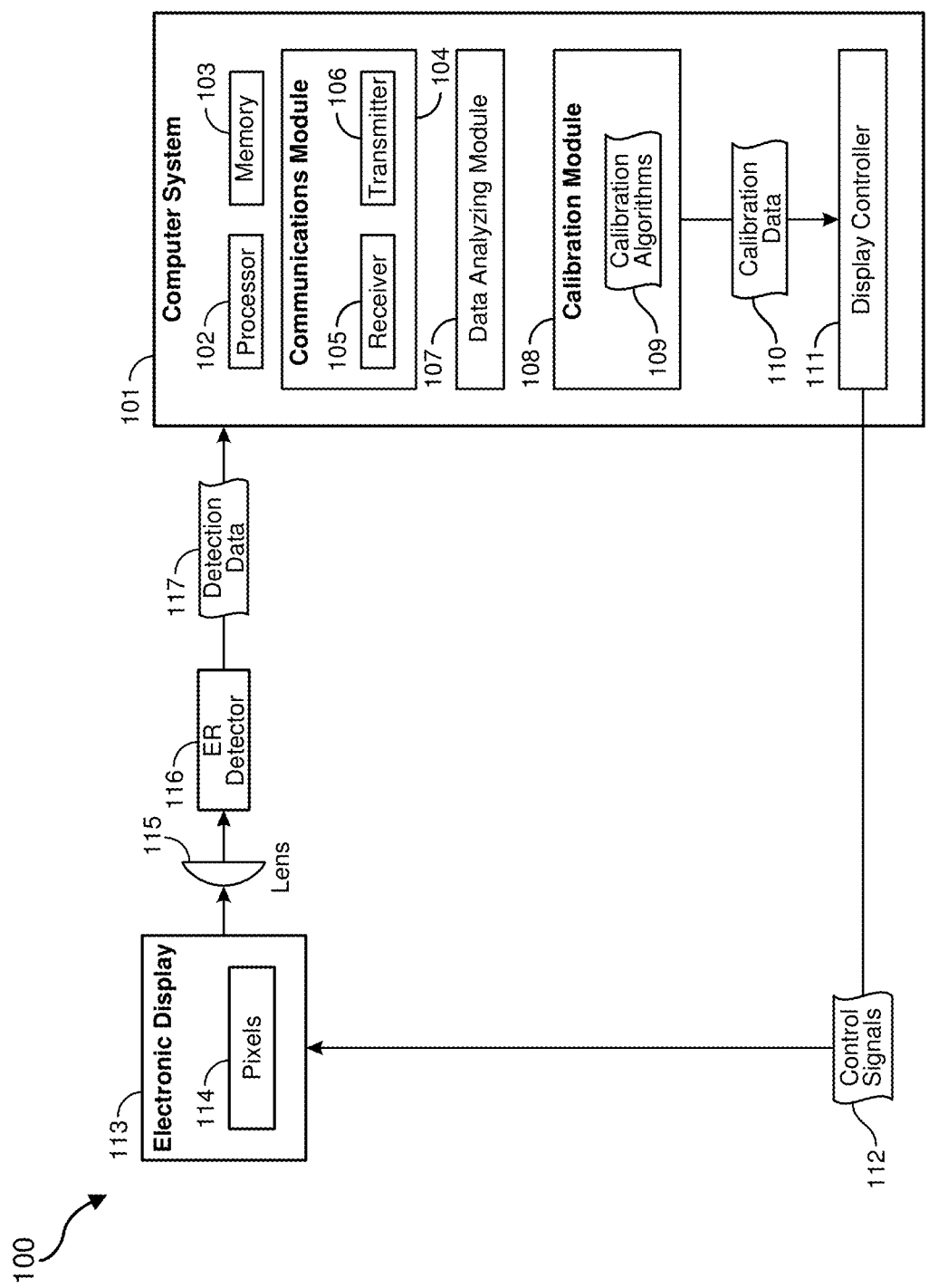
FIG. 1 illustrates a computing environment in which an electronic display may be calibrated.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to methods and systems for calibrating an electronic display. Many electronic displays use a grid of pixels to project an overall image. The grid may include many thousands or millions of pixels. Each of these pixels may be configured to project a certain color: typically, red, green, or blue. Each of these pixels may project the color at a different intensity, depending on a control signal from a graphics card or other display controller. Electronic displays used in artificial reality devices are typically positioned closer to the user's eyes than other displays such as televisions or desktop monitors. Because these artificial reality displays are closer to the user's eyes, the user may be able to more easily see discrepancies in the display. For example, some pixels may project at a different intensity than other pixels. The user's eyes may be able to spot these discrepancies and, when this happens, the user may be distracted from the artificial world projected by the display device.

In some cases, this pixel-to-pixel variation may be seen when the electronic display is set to display different levels of gray. Such variation in pixels is traditionally referred to as "mura." Mura generally describes the non-uniformity caused by pixel-to-pixel changes displayed at the same output gray level. This non-uniformity may be more prominent at lower output gray levels. When displaying a uniform dark scene, for example, rather than providing users with a great immersion experience, users may notice the variations among pixels, perhaps seeing some pixels projecting lighter or darker shades of grey.

The embodiments described herein may reduce mura experienced in an electronic display. In some cases, the electronic display may be calibrated on a pixel-by-pixel basis. For example, the systems described herein may calculate pixel-to-pixel calibration data and apply the calculated values to each red (R), green (G), and blue (B) channel when rendering images on that display. The embodiments described herein may analyze electromagnetic radiation emitted from an electronic display and generate calibration data for each color channel and/or for each pixel. This calibration data may then be used to test and calibrate for uniformity across pixels of an electronic display.

As will be explained in greater detail below, embodiments of the present disclosure may include a display calibration apparatus. The display calibration apparatus may include a lens and an actively-cooled electromagnetic radiation detector. The actively-cooled electromagnetic radiation (ER) detector may be configured to detect ER emitted from various pixels of an electronic display panel under test. The electromagnetic radiation may travel through the lens prior to reaching the ER detector. The apparatus may also include a special-purpose computing device configured to analyze the detected ER from the pixels of the electronic display panel and generate calibration data for the electronic display panel using a specified calibration algorithm. Accordingly, the electronic display panel may display images using the generated calibration data. Features from any of the embodiments described herein may be used in combination with one another in accordance with the general principles described herein. These and other embodiments, features, and advantages will be more fully understood upon reading the following detailed description in conjunction with the accompanying drawings and claims.

Figure 2:
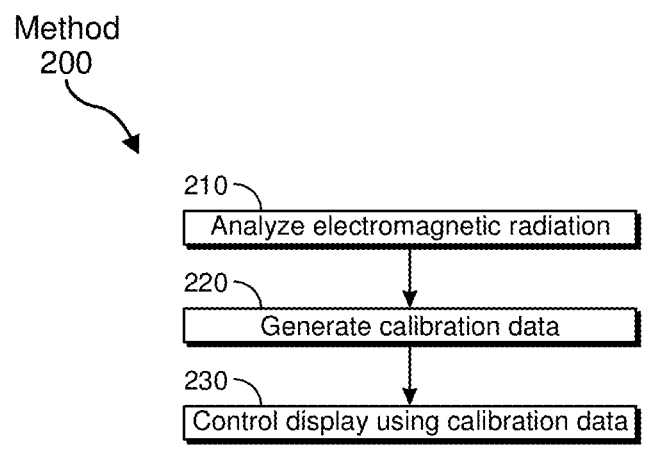
FIG. 2 is a flow diagram of an exemplary method for calibrating an electronic display.

The following will provide, with reference to FIGS. 1-7, detailed descriptions of a display calibration apparatus and methods for using the same. FIG. 1 illustrates a testing and calibration environment in which the embodiments herein may operate. FIG. 2 is a flow diagram of an exemplary method for calibrating a display under test, and FIGS. 3-7 illustrate different embodiments and variations of the described display calibration apparatus.

FIG. 1, for example, shows a computer system 101. The computer system 101 may be substantially any type of computer system including a local computer system or a distributed (e.g., cloud) computer system. The computer system 101 may include at least one processor 102 and at least some system memory 103. The computer system 101 may include program modules for performing a variety of different functions. The program modules may be hardware-based, software-based, or may include a combination of hardware and software. Each program module may use computing hardware and/or software to perform specified functions, including those described herein below.

For example, the communications module 104 may be configured to communicate with other computer systems. The communications module 104 may include any wired or wireless communication means that can receive and/or transmit data to or from other computer systems. These communication means may include hardware radios including, for example, a hardware-based receiver 105, a hardware-based transmitter 106, or a combined hardware-based transceiver capable of both receiving and transmitting data. The radios may be WIFI radios, cellular radios, Bluetooth radios, global positioning system (GPS) radios, or other types of radios. The communications module 104 may be configured to interact with databases, mobile computing devices (such as mobile phones or tablets), embedded or other types of computing systems.

The computer system 101 may further include a data analyzing module 107. The data analyzing module 107 may be configured to receive detection data 117 from an electromagnetic radiation detector 116. In some embodiments, the ER detector 116 may be configured to detect electromagnetic radiation emitted by an electronic display (e.g., 113). The electronic display may be any type of display that implements pixels 114 including liquid crystal displays (LCD), light-emitting diode (LED) displays, passive-matrix OLED (PMOLED), active-matrix OLED (AMOLED), or other type of electronic display. The electronic display 113 may be substantially any size or shape, including a television screen, a computer monitor, a handheld device, an artificial reality display (e.g., an augmented reality display or a virtual reality display such as those used in conjunction with systems 800-1300 of FIGS. 8-13 described below), a wearable device display, or other type of display.

When the display 113 emits electromagnetic radiation from the pixels 114, the ER may travel through at least one lens (which may have specific features and characteristics, described further below) to an ER detector 116. The ER detector may be a complementary metal-oxide-semiconductor (CMOS) ER detector, N-type metal-oxide-semiconductor (NMOS) ER detector, charge-coupled device (CCD) ER detector, a camera, a chromameter, or any other type of image sensor capable of detecting substantially any type of electromagnetic radiation. In some cases, the ER detector may be capable of taking high resolution images including at least 30 megapixels, at least 40 megapixels, at least 50 megapixels, or greater than 50 megapixels. Such a high-resolution camera may provide an increased number of samples per display pixel. As such, each pixel of the display under test may be sampled and detected by multiple light-detecting cells on the ER detector.

In some embodiments, the ER detector may be an actively-cooled ER detector. The active cooling may reduce heat generated by the ER detector during operation. This reduction in heat may allow the actively-cooled ER detector to detect electromagnetic radiation more accurately. For example, as the ER detector sensors detect electromagnetic radiation from a given pixel or group of pixels, the ER detector may begin to generate heat. This heat may cause noise or cross-talk between sensor cells when detecting electromagnetic radiation. As such, the noise may cause the ER detector to incorrectly detect the color and/or intensity values for certain pixels. This may, in turn, lead to faulty calibration values and an imbalanced display. Active cooling may reduce the heat generated during operation and may thus reduce noise, thereby increasing the accuracy and consistency of the ER detector 116.

In some cases, the ER detector 116 may be specifically calibrated and designed to detect human-visible light. In some embodiments, as will be explained further below, this human-visible light may be defined by specific wavelengths of light including those described in the international commission on illumination (CIE) 1931 color space. When these colors and other forms of electromagnetic radiation are detected by the ER detector 116, the detection data 117 may be sent to computer system 101 (or to any number of other local or remote computer systems).

The data analyzing module 107 of computer system 101 may analyze the detection data 117 to determine wavelengths, intensities, and other characteristics of the detected electromagnetic radiation. The ER detector 116 may detect ER data for each pixel 114 in a display or in certain pixels in the display. As noted above, the display 113 may exhibit some mura or pixel-to-pixel variation in projected light. The calibration module 108 of computer system 101 may implement one or more calibration algorithms 109 to generate calibration data 110 to counteract or fix the detected mura. The calibration data 110 may specify, for each pixel, how that pixel is to project light for content that is to be displayed on the electronic display 113. For instance, the calibration data 110 may specify that a given pixel or group of pixels is to project at a lower or higher intensity. As such, the display controller 111 may receive the calibration data 110 and may generate control signals 112 for the electronic display 113 that drive the identified pixels or group of pixels at the lower or higher intensity. These and other embodiments will be described in greater detail below with regard to method 200 of FIG. 2.

FIG. 2 is a flow diagram of an exemplary computer-implemented method 200 for calibrating an electronic display. The steps shown in FIG. 2 may be performed by any suitable computer-executable code and/or computing system, including the system illustrated in FIG. 1. In one example, each of the steps shown in FIG. 2 may represent an algorithm whose structure includes and/or is represented by multiple sub-steps, examples of which will be provided in greater detail below.

As illustrated in FIG. 2, at step 210, the data analyzing module 107 of FIG. 1 may analyze various portions of electromagnetic radiation detected by an actively-cooled electromagnetic radiation detector (e.g., 116 of FIG. 1). The actively-cooled ER detector 116 may be configured to detect electromagnetic radiation emitted from various pixels 114 of an electronic display panel under test (e.g., 113). The electromagnetic radiation may travel through at least one lens 115 prior to reaching the detector 116. At step 220, the calibration module 108 of computer system 101 may generate calibration data 110 for the electronic display panel 113 using a specified calibration algorithm 109. At step 230, the display controller 111 of computer system 101 may control the electronic display panel 113 using the generated calibration data 110. For example, the display controller 111 may use the calibration data 110 (which indicates how the individual pixels 114 are to be driven) to generate control signals 112 that drive the electronic display 113 according to the calibration data 110.

Figure 3A:
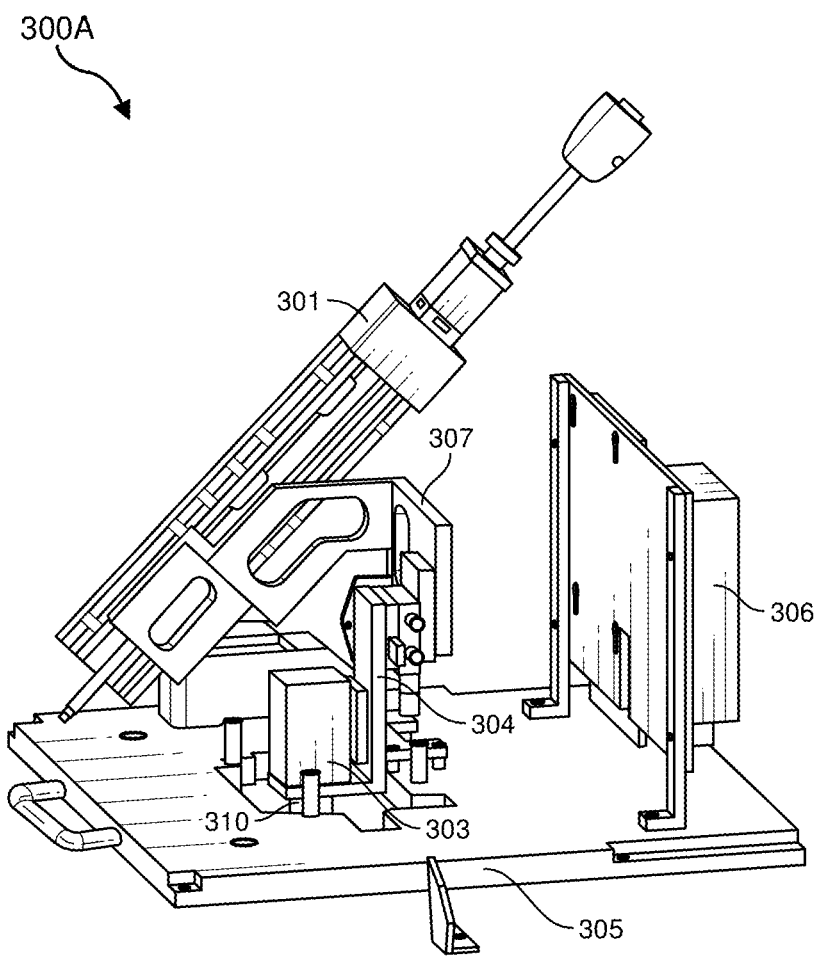
FIGS. 3A and 3B illustrate embodiments in which a testing device may be used to test and calibrate an electronic display.
Figure 3B:
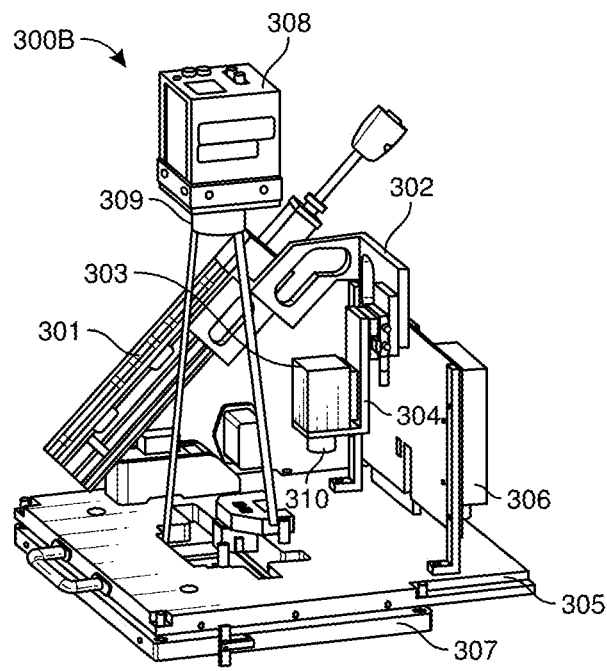

FIGS. 3A and 3B illustrate embodiments of a display testing apparatus. FIG. 3A, for example, illustrates an example of display testing apparatus 300A which includes various components. The display testing apparatus 300A may, for example, include an ER detector 303 positioned toward a display that lies underneath the testing apparatus (e.g., display 307 of FIG. 3B). The ER detector 303 may be substantially any type of ER detector including any of the ER detector types described above. The ER detector 303 may be held in place via a stand or support structure 304. The support structure 304 may be coupled to a linking member 302 that links the support structure 304 to an adjusting member 301. Both the linking member 302 and the support structure may be attached to a base 305. The adjusting member 301 may allow the linking member 302 (and the attached support structure 304) to slide up or down the rails of the adjusting member 301. In some embodiments, the linking member 302 may be slid along the rails of the adjusting member 301 until contacting a backing plate 306.

When in an initial testing position, as shown in FIG. 3A, the display testing apparatus 300A may position the ER detector 303 over a display. The ER detector 303 may include a lens 310 through which the electromagnetic radiation emitted from the display may travel. The lens 310 may be substantially any type of lens. However, in some embodiments, the lens 310 may include specific characteristics. These characteristics may be taken into account by the calibration algorithm 109 when generating the calibration data 108. For instance, the lens may include a very low amount of distortion. In some cases, the amount of distortion in the lens 310 may be below a specified threshold. A lower amount of distortion may allow the ER detector 303 to better distinguish between different pixels emitting radiation. When the amount of distortion is below a specified threshold, the calibration module 108 may take this into consideration, knowing that the detection data 117 received will be specific enough to distinguish between columns and rows of pixels and even to distinguish single pixels. Additional details regarding lens characteristics will be discussed further below.

FIG. 3B illustrates an embodiment of a display testing apparatus 300B that includes a secondary ER detector 308. At least in some embodiments, the display testing apparatus 300B may be substantially similar to the display testing apparatus 300A of FIG. 3A, including many of the same components. However, in FIG. 3B, a different, secondary ER detector 308 may be positioned above the display under test 307. The secondary ER detector 308 may be a diffractive optical elements (DOE) ER detector, chromameter, or other type of ER detector. The initial ER detector 303 may be moved out of its initial position (as shown in FIG. 3A) and into a position abutting the backing plate 306 (as shown in FIG. 3B). The secondary ER detector 308 may include its own lens 309 that may be different than or the same as lens 310 of ER detector 303. The secondary ER detector 308 may be held in position via mounting members (now shown). In some embodiments, the first ER detector 303 may be used to test certain aspects of the display 307, while the secondary ER detector 308 may be used to test other aspects or characteristics of the display 307.

Figure 4:
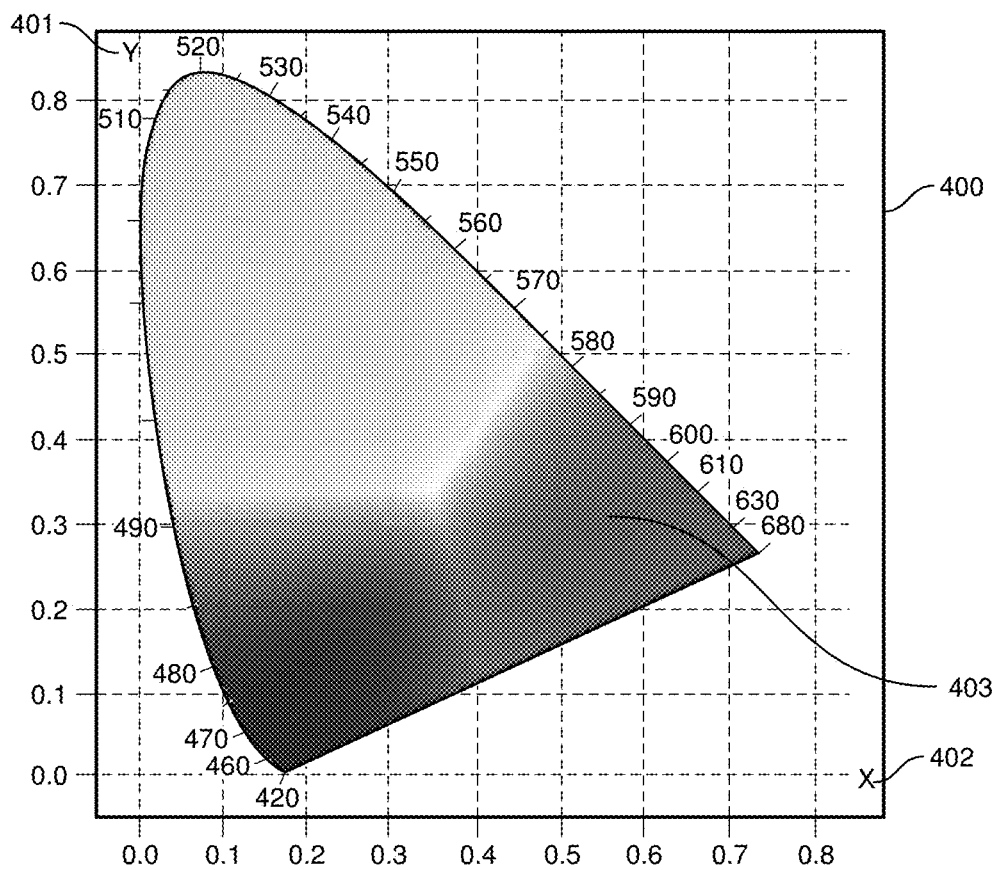
FIG. 4 illustrates a graph mapping electromagnetic radiation wavelengths to visible colors of light.

In some cases, the ER detectors 303/308 may be configured to detect colors as specified in chart 400 of FIG. 4. Chart 400 of FIG. 4 generally describes the subjective color perception of the human eye. The chart 400 represents, for example, the CIE 1931 color space or color space chromacity 403. The y-axis 401 and the x-axis 402 may each represent chromacity values with wavelengths shown in nanometers (e.g., 680 nm for red, 520 nm for green, and 420 nm for blue).

When a user is wearing an augmented reality or virtual reality headset, the user's color perception of each subpixel may be of increased importance. For instance, such headsets are typically very close to a user's eyes (e.g., within 2-5 inches). As such, the user may experience an amplification effect due to the artificial reality headset lenses. Differences in colors may stand out and may be readily apparent to the user, thus degrading the user's experience. In at least some of the embodiments herein, the calibration data 110 generated by the computer system 101 may apply pixel-level CIE 1931 characterization for each pixel or each group of pixels in the display. The calibration data 110 may include photopic intensities as well as CIE 1931 color characterizations, as opposed to traditional systems which may only include CIE 1931 characterization with macro scale regions of interests (e.g., 100 by 100 microns or above), or may include only monochrome pixel level light radiometric intensities. The color and photopic intensities provided by the calibration module 108 may be more detailed and more precise than those provide by traditional systems.

Figure 5:
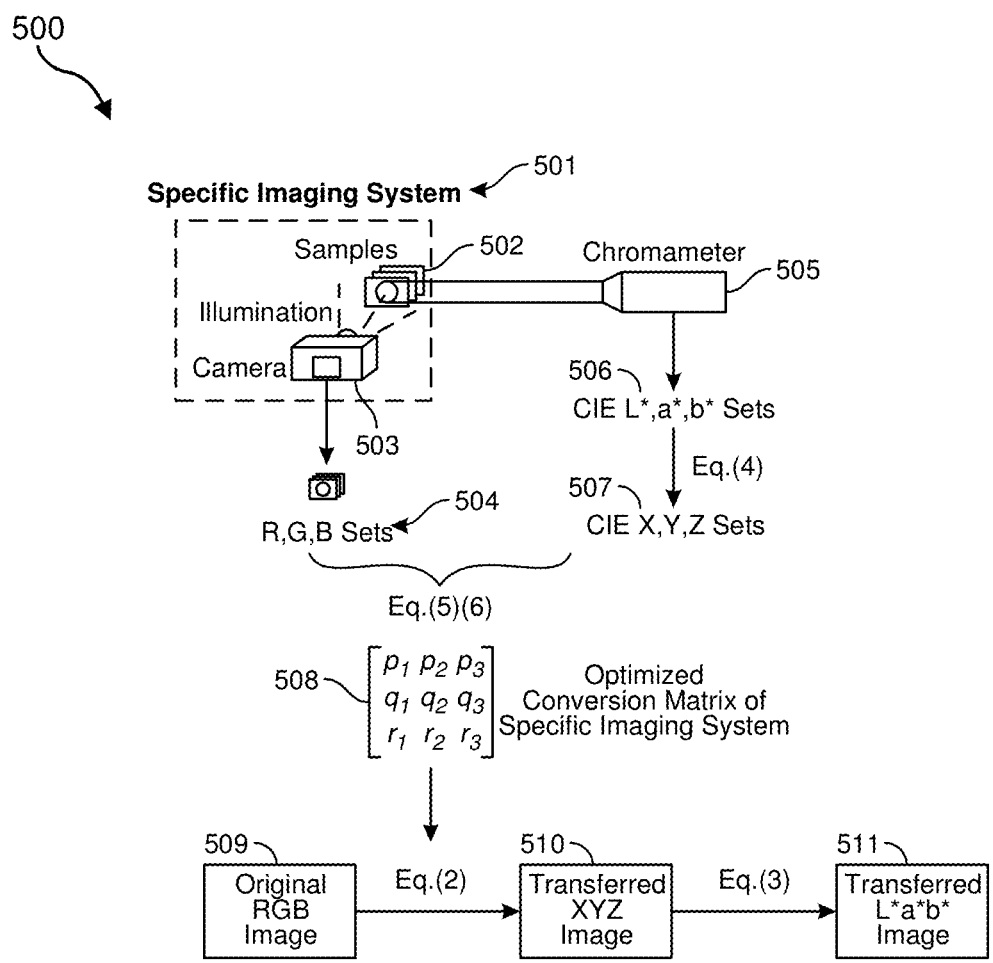
FIG. 5 illustrates a testing architecture in which various components are implemented to calibrate an electronic display.

FIG. 5 illustrates one example of a computing architecture 500 in which a display testing apparatus may take an image of a display panel under test and generate a specific output. For instance, the architecture 500 may include an imaging system 501 that points two different ER detectors (e.g., camera 503 and chromameter 505) at a display 502. The ER detectors 503 and 505 may take samples of the display and store those samples in different ways. For example, the camera 503 may store the images as R, G, B sets 504 that specify the red, green, and blue values for the sample. The chromameter 505 may store the data as CIE L*, b* sets 506 and convert those sets to CIE X, Y, Z sets 507. In this embodiment, a computing system or other special-purpose computing hardware (e.g., an application-specific integrated circuit (ASIC) or field-programmable gate array (FPGA)) may be used to calculate an optimized conversion matrix 508 from both the R, G, B data set 504 from the camera 503 and the CIE X, Y, Z data set 507 from the chromameter 505. Thus, computing system or special-purpose computing hardware may take an original RGB image 509 and a CIE X, Y, Z image 510 and create an L*a*b* image 511 which may be used to identify pixel-to-pixel variations in the display being tested.

As noted above, the ER detectors may be actively-cooled ER detectors. For instance, either or both of ER detectors 503 and 505 may be actively-cooled. The ER detectors 503 and 505 may be CMOS-based or CCD-based. Implementing actively-cooled CMOS or CCD electromagnetic radiation detectors may reduce noise and allow for greater precision and accuracy when detecting ER. The lenses used by these ER detectors 503 and 505 (or 116 of FIG. 1) may also have specific characteristics. In some cases, the calibration data that is generated for the electronic display panel may be dependent on these lens characteristics.

For example, the lens (e.g., 309 or 310 of FIG. 3, or 115 of FIG. 1) may have various specified characteristics configured to increase the accuracy of the calibration data 110 including a specified minimum level of resolution. This specified minimum level of resolution may indicate that the lens 115 is to have at least a certain minimum amount of resolution or the lens will not be used. In such cases, generation of the calibration data 110 by the calibration module 108 may be dependent on the lens having the specified minimum level of resolution. For example, the calibration data 110 may be generated based on the assumption that the ER detection data 117 detected after passing through the lens 115 is at a minimum level of resolution. In some cases, this minimum level of resolution may be very high, such that the ER detection data 117 is very clear and detailed. A lens with a very low level of distortion may provide a very clear and sharp image. The calibration module 108 may rely on this level of sharpness when generating the calibration data 110.

Similarly, the lens 115 may have other specified characteristics configured to increase the accuracy of the calibration data including a specified maximum level of distortion. The specified maximum level of distortion may indicate that lens 115 is to have a certain maximum level of distortion or the lens will not be used. In some cases, the maximum level of distortion for the lens may be set very low. As such, the lens may be sure to have a very low level of distortion. Again, the calibration module 108 of FIG. 1 may rely on the lens having this relatively low maximum level of distortion. The low level of distortion in the lens may provide an increased amount of detail and clarity in the ER detection data 117. This increased amount of detail and clarity may be in addition to anything provided by the minimum level of resolution in the lens. The calibration module 108 may thus depend, at least in some cases, on receiving ER detection data 117 from a lens with specified maximum level of distortion.

Still further, the lens 115 may have a characteristic configured to increase the accuracy of the calibration data, which characteristic is a specified maximum level of field curvature. The specified maximum level of field curvature may indicate that the lens 115 does not spread the image beyond a maximum level of field curvature. As will be noted herein, field curvature of the lens may cause a flat object to appear sharp only in a certain part or parts of the image, instead of being uniformly sharp across the image. Because image sensors are typically flat, the curvature of the lens 115 may guarantee that at least some portions of the image will be out of focus. Accordingly, in at least some of the embodiments herein, the field curvature of the lens 115 may be selected to be very low and below a specified maximum level. The calibration module 108 may take this level of field curvature into consideration when generating the calibration data 110. In some cases, the calibration module 108 may be dependent on the level of field curvature being below a specified maximum level. This dependence may be in addition to or alternative to the minimum level of resolution and maximum level of distortion described above.

The lens may also have a specified characteristic designed to increase the accuracy of the calibration data, which characteristic is a specified maximum level of chromatic aberration. Chromatic aberration, as described herein, may refer to a lens' inability to focus all of the colors onto a single point. In some cases, different wavelengths of electromagnetic radiation may take different paths (i.e., they may diffract differently) through the lens. As such, each of the colors may contact the image sensor at a different position. This chromatic aberration or spreading of colors onto different points on the image sensor may have detrimental effects on the color saliency of the detection data 117. The maximum level of chromatic aberration for the lens 115 may ensure that lenses with too high of a chromatic aberration will not be used. The calibration module 108 may depend on the ER detection data 117 having a minimal amount of chromatic aberration that is below the specified maximum. Moreover, having a lens with a low chromatic aberration may eliminate the need to do focus adjustment when measuring different color channels, as each color channel focuses in substantially the same location. As with the other lens characteristics, the maximum level of chromatic aberration may be in addition to or alternative to the maximum level of field curvature, the minimum level of resolution, and the maximum level of distortion described above.

Still further, the lens 115 may have a specific aspect ratio. The aspect ratio associated with the lens 115 may match an aspect ratio associated with the display panel. As such, when the ER detector 116 is directed toward the display panel 113, the lens may have a similar or same aspect ratio. This may allow the ER detector to capture an accurate image of the electronic display 113 that is in an expected ratio. In some cases, the calibration module 108 may depend on the lens having a specific aspect ratio relative to the electronic display 113. This may allow the calibration module 108 to generate calibration data 110 with the knowledge that the aspect ratio of the lens 115 to the electronic display 113 is within a certain tolerance, and that any ratio beyond the specified ratio may not be expected. By having an ER detector whose sensor area is aligned with the aspect ratio of the electronic display panel, no additional space may be needed to compensate for space wasted by a mismatched ratio. Indeed, if the ER detector's sensor area has a much smaller aspect ratio as compared to the electronic display 113, a larger ER detector may be needed. By matching the ratio of each, the capabilities of the ER detector may be maximized without being larger than necessary.

In some embodiments, the calibration module 108 may use a certain calibration algorithm 109 to generate the calibration data 110. The calibration algorithm may be one of many different calibration algorithms, each of which may be used in whole or in part to generate the calibration data 110. In some cases, the lens 115 and the electromagnetic radiation detector 116 may be configured to match various characteristics of the specified calibration algorithm. For instance, if the algorithm 109 is designed to analyze centroids or other patterns among the pixels 114, the algorithm may be aided by certain lens choices with more or less field curvature, with more or less resolution, with more or less distortion, etc. Thus, the specific characteristics of the lens 115 and/or the ER detector 116 may be selected to compliment the functionality of the calibration algorithm 109.

Accordingly, in some embodiments, one specific lens with characteristics A & B may be used with an ER detector having characteristics C & D when generating calibration data 110 using a specific calibration algorithm X. In other cases, a different lens with characteristics A' & B' may be used with an ER detector having characteristics C' & D' & E when generating calibration data 110 using a different calibration algorithm Y. Thus, depending on which calibration algorithm 109 is used, hardware components including the lens 115 and the ER detector 116 may be selected to match the needs of the calibration algorithm.

Figure 6:
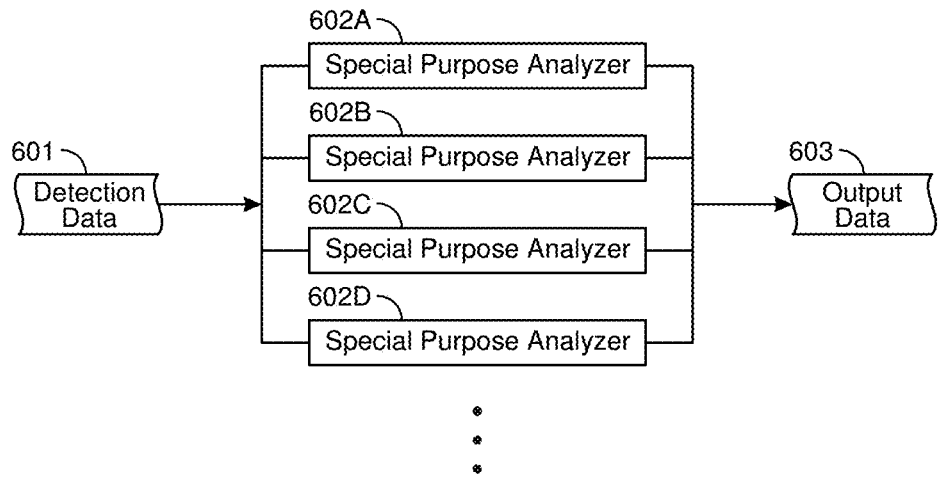
FIG. 6 illustrates a computing environment in which multiple special purpose computing systems are used in parallel to analyze electromagnetic radiation from an electronic display.

FIG. 6 illustrates an embodiment in which the data analyzing module 107 of FIG. 1 may include multiple special-purpose analyzers. For example, as shown in FIG. 6, detection data 601 may be received from an ER detector. The detection data 601 may be fed to a plurality of different special-purpose computing devices. As noted above, these special-purpose computing devices may include ASICs, FPGAs, systems on a chip (SOCs), or other types of special-purpose computing systems. In some cases, the step of analyzing detected electromagnetic radiation from the pixels 114 of the electronic display panel 113 (e.g., step 210 of FIG. 2) may be performed in parallel by a plurality of special-purpose computing devices. For instance, each of the four depicted special-purpose analyzers 602A-602D may be implemented to perform the analyzing step at the same time. It will be recognized that, while four special-purpose computing devices are shown in FIG. 6, substantially any number may be used. These special-purpose analyzers may each take a portion of the received detection data 601 from the ER detector and may each process a separate portion of that data. After the analysis, the output data 603 from each special-purpose analyzer may be stitched together to form a cohesive image or sensor pattern.

Figure 7:
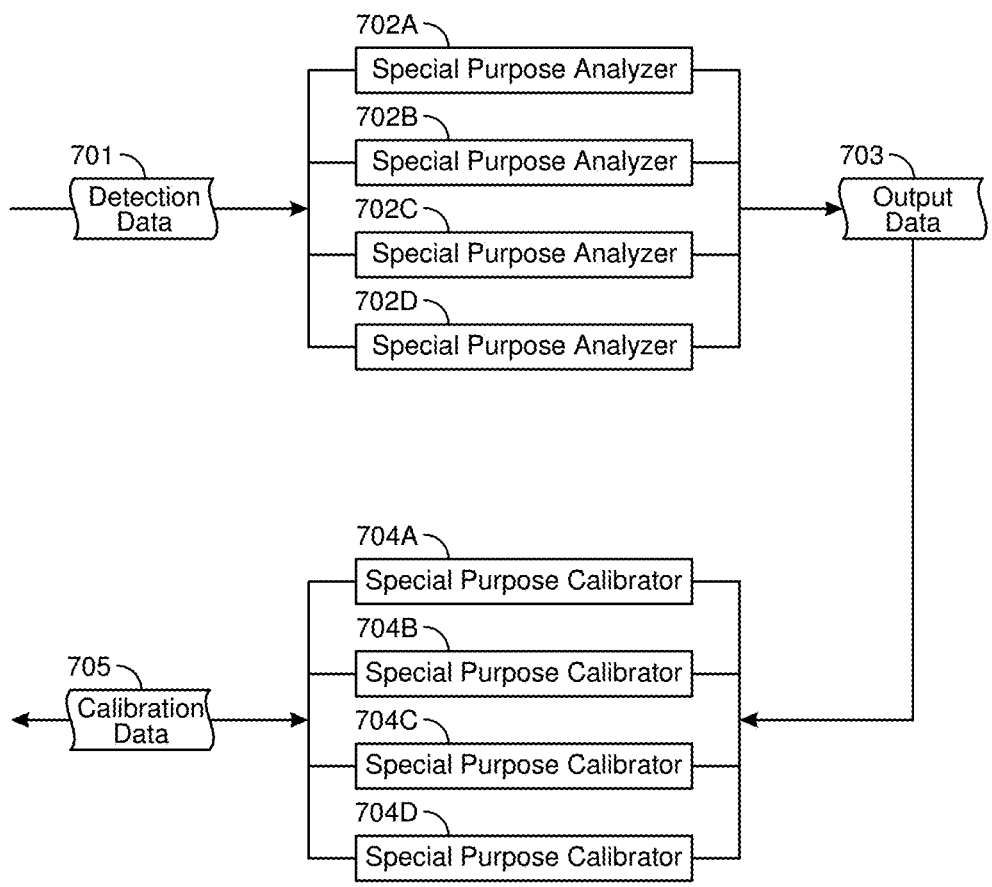
FIG. 7 illustrates a computing environment in which multiple special purpose computing systems are used in parallel to analyze electromagnetic radiation from an electronic display and to generate calibration data.

Similarly, as shown in FIG. 7, a display calibration apparatus may include both special-purpose analyzers 702A-702D and special-purpose calibrators 704A-704B. In such cases, detection data 701 may be received from an ER detector and may be parallel processed by the special-purpose analyzers 702A-702D. The output data 703 may be fed to the special-purpose calibrators 704A-704D and there be processed in parallel to create the output calibration data 705. As with the special-purpose analyzers 602A-602D of FIG. 6, the special-purpose analyzers 702A-702D and the special-purpose calibrators 704A-704D may each be any type of special-purpose computing device. The special-purpose calibrators 704A-704D may be configured to work in parallel to generate calibration data 705 from the output data 703. Accordingly, the step of generating calibration values for the electronic display panel using a specified calibration algorithm (e.g., step 220 of FIG. 2) may be performed in parallel by the special-purpose calibrators 704A-704D.

In some cases, additional processing speed benefits may be provided by analyzing subsequent images or sensor patterns from the same display or from other displays while the special-purpose calibrators 704A-704D are generating the calibration data 705. Thus, after an initial batch of output data 703 has been generated and the special-purpose calibrators 704A-704D are generating calibration data 705, the special-purpose analyzers 702A-702D may begin analyzing new detection data 701 from the same electronic display or from another electronic display. Thus, the calibration data for the electronic display may be generated in parallel while the detection data 701 are analyzed in parallel. Such parallel processing may greatly increase processing speeds and may reduce overall testing times.

For example, an ER detector may require a minimum amount of exposure time for each image (e.g., 15 seconds). While subsequent images are being taken, the special-purpose analyzers 702A-702D and the special-purpose calibrators 704A-704D may be analyzing and generating calibration data. Similarly, special-purpose analyzers may take a specified amount of time to calculate a centroid for an OLED display, for example. This centroid calculation may be performed in parallel by the special-purpose analyzers 702A-702D, while the special-purpose calibrators 704A-704D are calculating calibration data 705 based on earlier output data 703. Because the calculation times may be greatly reduced, the overall number of testing stations for a batch of electronic displays may also be reduced. Reducing the number of testing stations may reduce testing cost and may free up space for other hardware components. Reducing the amount of time spent performing the analyzing and calibration calculations may also allow the electromagnetic radiation detector to increase the amount of exposure time gathering electromagnetic radiation. This may, in turn, lead to better detection data 117 and ultimately better calibration data 110.

In some cases, the amount of exposure time may be dependent on the number of parallelized special-purpose computing systems. For example, if a lower number of parallelized special-purpose computing systems (e.g., 702A-702D of FIG. 7) are used by the display calibration system, then the ER detector may use a shorter exposure time. On the other hand, if a higher number of parallelized special-purpose computing systems are in use in the display calibration system, the ER detector may use a longer exposure time. For instance, if a display testing area had a specific allotted time for each display, because less of that allotted time was spent in the analyzing and calibration data calculation portions, more of that allotted time could be spent exposing the ER detector 116 to the electronic display 113. Thus, at least in some embodiments, the amount of exposure time associated with the detection of electromagnetic radiation emitted from the pixels 114 of the electronic display panel 113 under test may be reduced or increased based on the number of parallelized special-purpose computing systems. This reduction or increase in exposure time may occur dynamically as special-purpose computing devices are added to or removed from the display calibration system.

As noted above, the ER detector 116 may include a high-resolution image capturing system or ER sensing system. The high-resolution image capturing system may capture images at 50 megapixels or more. This level of resolution may allow the ER detector to allocate multiple detecting pixels for each pixel of the electronic display panel 113. By using multiple detecting pixels for each display pixel 114, the ER detector may take a highly accurate and reliable measurement of the chromacity and intensity of the electromagnetic radiation emitted from each pixel. The ER detector may also be actively cooled, which may reduce cross-talk between pixels, thereby generating an even more precise ER measurement for each pixel. In cases where the actively-cooled ER detector is configured to identify various centroids in the electronic display panel 113, this identifying of centroids may be aided by a higher resolution image from the ER detector 116. The high-resolution images coming from such an ER detector may include a large amount of data and, as such, parallel processing systems such as those described in FIGS. 6 and 7 may be used to parallel process the high-resolution data 117.

In some embodiments, the calibration data 110 may be applied to the display 113 while the display is being tested. Updated measurements from the display under test may be used as feedback to tweak the calibration data. For instance, mura calibration data may be applied to electronic display 113 while the display is being tested. The tests may show where pixel-to-pixel variations still exist, even after applying the mura calibration data. The ER detector 116 may then detect new data 117, and the calibration module 108 may generate new calibration data 110 which may be applied to the display 113 and still further measurements may be taken. This feedback cycle may be repeated as many times as desired to ensure that the mura level for the electronic display is as desired.

In some embodiments, a system may be provided which includes the following: a lens and an actively-cooled electromagnetic radiation detector configured to detect electromagnetic radiation emitted from one or more pixels of an electronic display panel under test. The electromagnetic radiation may travel through the lens prior to reaching the detector. The system may also include at least one physical processor and physical memory comprising computer-executable instructions that, when executed by the physical processor, cause the physical processor to perform the following: analyze the detected electromagnetic radiation from the one or more pixels of the electronic display panel, and generate calibration data for the electronic display panel using a specified calibration algorithm, such that the electronic display panel operates using the generated calibration data.

Accordingly, in this manner, specific hardware components may be implemented in a display calibration apparatus to improve the functionality of that apparatus. Specific lenses with certain characteristics may be used when capturing image sensor data. Moreover, specific types of ER detectors may be used to ensure that noise and cross-talk are kept to a minimum and that the detected image data are clear and precise. Still further, multiple special-purpose computing systems may be used to speed up specific parts of the display testing process. The components used in the display testing apparatus may even depend on the number of special-purpose computing systems used. As such, the embodiments described herein may provide a display testing apparatus that is not only more efficient than traditional testing systems, but is also more precise and leads to displays that are more consistent and are more enjoyable to wear by a user.

Example Embodiments

Example 1. A display calibration apparatus may include: a lens, an actively-cooled electromagnetic radiation detector configured to detect electromagnetic radiation emitted from one or more pixels of an electronic display panel under test, wherein the electromagnetic radiation travels through the lens prior to reaching the detector, and a special-purpose computing device configured to: analyze the detected electromagnetic radiation from the one or more pixels of the electronic display panel, and generate calibration data for the electronic display panel using a specified calibration algorithm, such that the electronic display panel operates using the generated calibration data.

Example 2. The display calibration apparatus of Example 1, wherein the actively-cooled electromagnetic radiation detector comprises an actively-cooled complementary metal-oxide-semiconductor (CMOS) detector.

Example 3. The display calibration apparatus of any of Examples 1 and 2, wherein: the lens has one or more specified characteristics configured to increase the accuracy of the calibration data including a specified minimum level of resolution; and generation of the calibration data is dependent on the specified minimum level of resolution.

Example 4. The display calibration apparatus of any of Examples 1-3, wherein: the lens has one or more specified characteristics configured to increase the accuracy of the calibration data including a specified maximum level of distortion; and generation of the calibration data is dependent on the specified maximum level of distortion.

Example 5. The display calibration apparatus of any of Examples 1-4, wherein: the lens has one or more specified characteristics configured to increase the accuracy of the calibration data including a specified maximum level of field curvature; and generation of the calibration data is dependent on the specified maximum level of field curvature.

Example 6. The display calibration apparatus of any of Examples 1-5, wherein: the lens has one or more specified characteristics configured to increase the accuracy of the calibration data including a specified maximum level of chromatic aberration; and generation of the calibration data is dependent on the specified maximum level of chromatic aberration.

Example 7. The display calibration apparatus of any of Examples 1-6, wherein an aspect ratio associated with the lens matches an aspect ratio associated with the display panel.

Example 8. The display calibration apparatus of any of Examples 1-7, wherein the lens and electromagnetic radiation detector are configured to match one or more characteristics of the specified calibration algorithm.

Example 9. The display calibration apparatus of any of Examples 1-8, wherein the step of analyzing the detected electromagnetic radiation from the one or more pixels of the electronic display panel performed by the special-purpose computing device is performed in parallel by a plurality of special-purpose computing devices.

Example 10. The display calibration apparatus of any of Examples 1-9, wherein the step of generating calibration values for the electronic display panel using a specified calibration algorithm is performed in parallel by a plurality of special-purpose computing devices.

Example 11. A computer-implemented method may include: analyzing one or more portions of electromagnetic radiation detected by an actively-cooled electromagnetic radiation detector, the actively-cooled electromagnetic radiation detector being configured to detect electromagnetic radiation emitted from one or more pixels of an electronic display panel under test, the electromagnetic radiation traveling through at least one lens prior to reaching the detector, generating calibration data for the electronic display panel using a specified calibration algorithm, and controlling the electronic display panel using the generated calibration data.

Example 12. The computer-implemented method of Example 11, wherein electromagnetic radiation detected from one or more different electronic display panels is analyzed while the calibration data are being generated.

Example 13. The computer-implemented method of any of Examples 11 and 12, wherein the calibration data for the electronic display are generated in parallel.

Example 14. The computer-implemented method of any of Examples 11-13, wherein the parallel generation of calibration data allows an increased exposure time by the electromagnetic radiation detector.

Example 15. The computer-implemented method of any of Examples 11-14, wherein the electromagnetic radiation detector includes at least a plurality of detecting pixels for each pixel of the display panel.

Example 16. The computer-implemented method of any of Examples 11-15, wherein a sensor area on the electromagnetic radiation detector is aligned with an aspect ratio of the electronic display panel.

Example 17. The computer-implemented method of any of Examples 11-16, wherein analyzing one or more portions of electromagnetic radiation detected by an actively-cooled electromagnetic radiation detector includes identifying one or more centroids in the electronic display panel.

Example 18. The computer-implemented method of any of Examples 11-17, wherein the step of identifying one or more centroids in the electronic display panel is parallelized across two or more special-purpose computing systems.

Example 19. The computer-implemented method of any of Examples 11-18, wherein an amount of exposure time associated with the detection of electromagnetic radiation emitted from the one or more pixels of the electronic display panel under test is reduced or increased based on the number of parallelized special-purpose computing systems.

Example 20. A system may include: a lens, an actively-cooled electromagnetic radiation detector configured to detect electromagnetic radiation emitted from one or more pixels of an electronic display panel under test, wherein the electromagnetic radiation travels through the lens prior to reaching the detector, at least one physical processor, and physical memory comprising computer-executable instructions that, when executed by the physical processor, cause the physical processor to: analyze the detected electromagnetic radiation from the one or more pixels of the electronic display panel, and generate calibration data for the electronic display panel using a specified calibration algorithm, such that the electronic display panel operates using the generated calibration data.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 800 in FIG. 8. Other artificial reality systems may include a NED that also provides visibility into the real world (e.g., augmented-reality system 900 in FIG. 9) or that visually immerses a user in an artificial reality (e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 8:
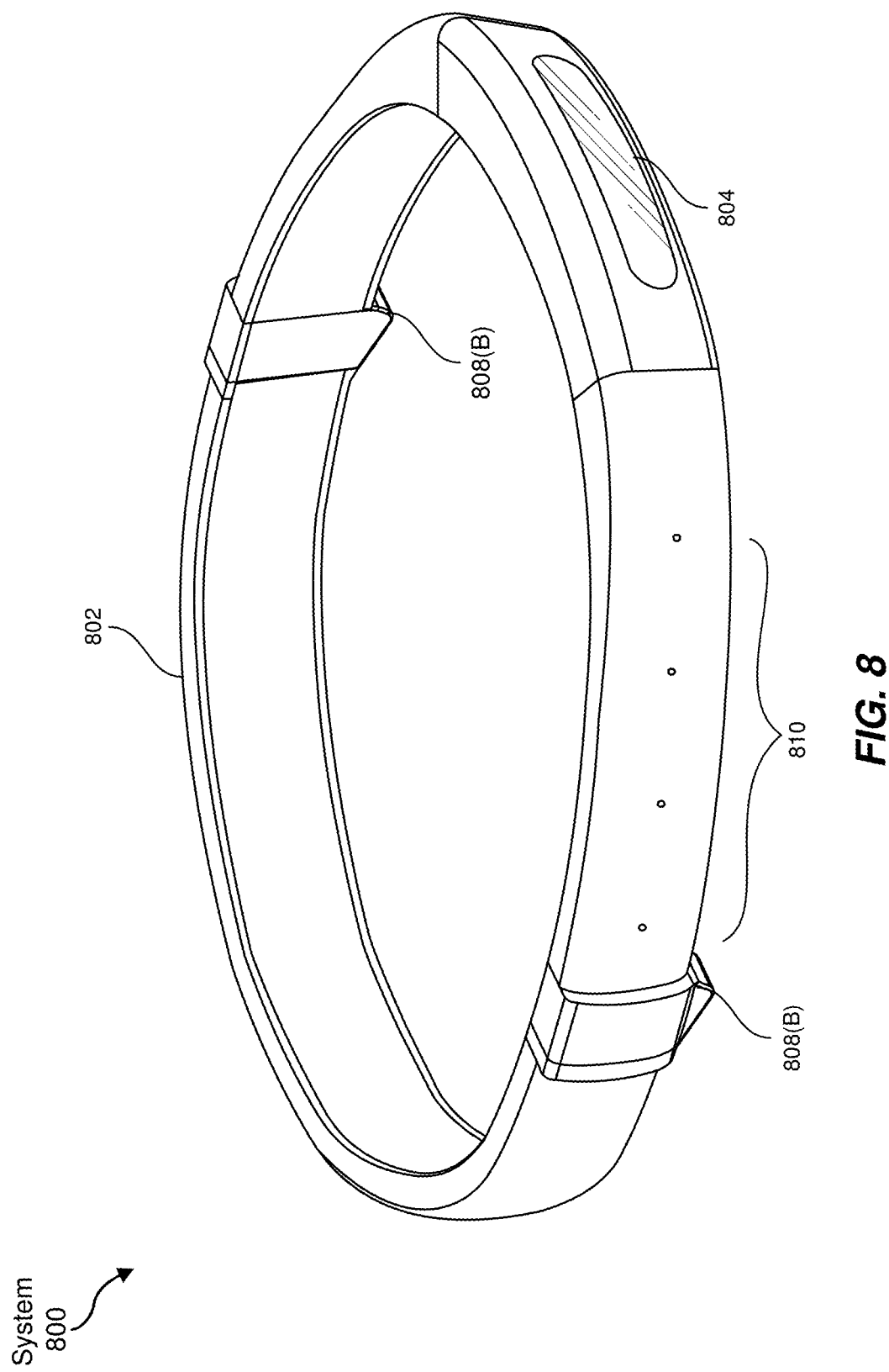
FIG. 8 is an illustration of an exemplary artificial-reality headband that may be used in connection with embodiments of this disclosure.

Turning to FIG. 8, augmented-reality system 800 generally represents a wearable device dimensioned to fit about a body part (e.g., a head) of a user. As shown in FIG. 8, system 800 may include a frame 802 and a camera assembly 804 that is coupled to frame 802 and configured to gather information about a local environment by observing the local environment. Augmented-reality system 800 may also include one or more audio devices, such as output audio transducers 808(A) and 808(B) and input audio transducers 810. Output audio transducers 808(A) and 808(B) may provide audio feedback and/or content to a user, and input audio transducers 810 may capture audio in a user's environment.

As shown, augmented-reality system 800 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 800 may not include a NED, augmented-reality system 800 may include other types of screens or visual feedback devices (e.g., a display screen integrated into a side of frame 802).

Figure 9:
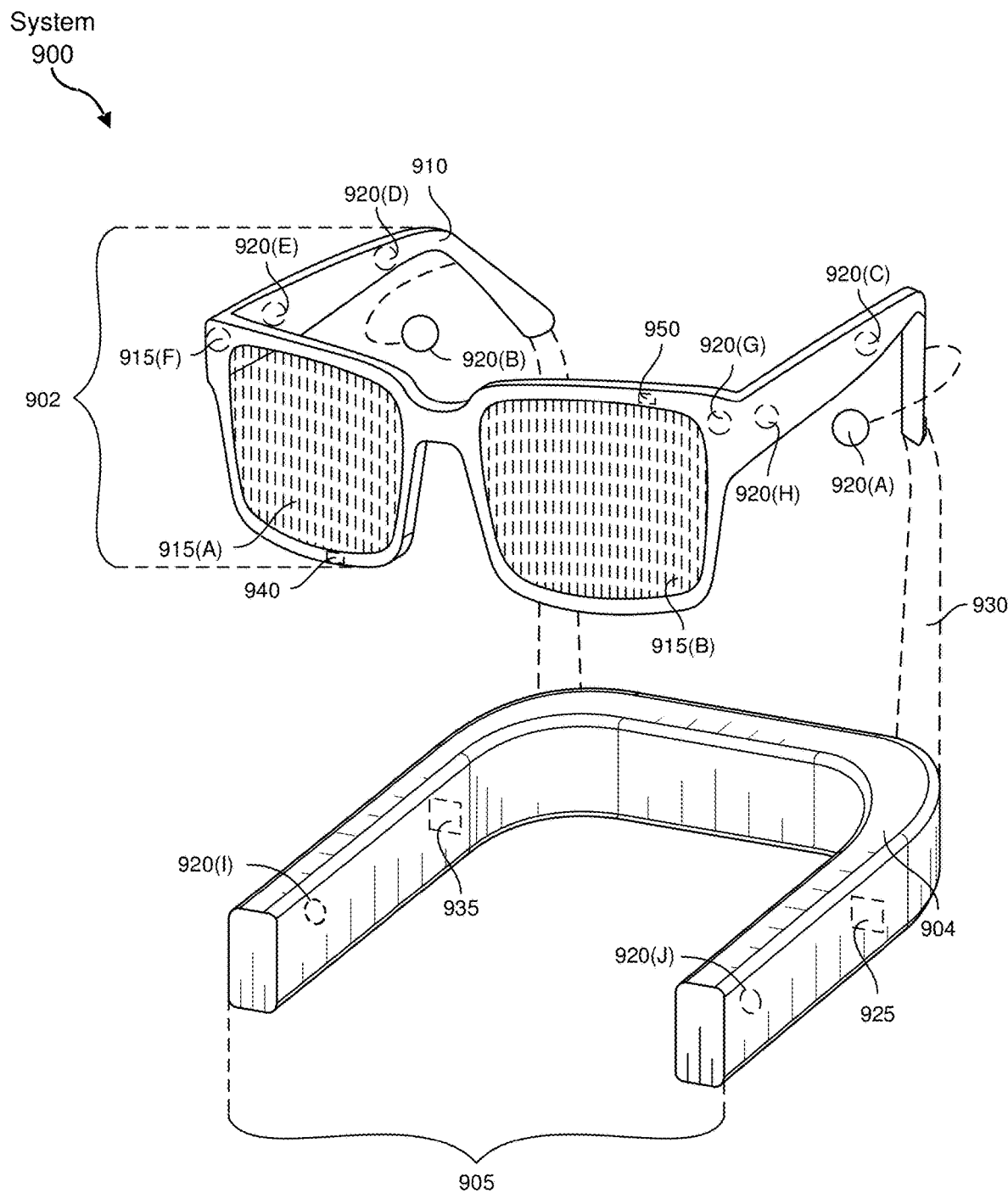
FIG. 9 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 9, augmented-reality system 900 may include an eyewear device 902 with a frame 910 configured to hold a left display device 915(A) and a right display device 915(B) in front of a user's eyes. Display devices 915(A) and 915(B) may act together or independently to present an image or series of images to a user. While augmented-reality system 900 includes two displays, embodiments of this disclosure may be implemented in augmented-reality systems with a single NED or more than two NEDs.

In some embodiments, augmented-reality system 900 may include one or more sensors, such as sensor 940. Sensor 940 may generate measurement signals in response to motion of augmented-reality system 900 and may be located on substantially any portion of frame 910. Sensor 940 may represent a position sensor, an inertial measurement unit (IMU), a depth camera assembly, or any combination thereof. In some embodiments, augmented-reality system 900 may or may not include sensor 940 or may include more than one sensor. In embodiments in which sensor 940 includes an IMU, the IMU may generate calibration data based on measurement signals from sensor 940. Examples of sensor 940 may include, without limitation, accelerometers, gyroscopes, magnetometers, other suitable types of sensors that detect motion, sensors used for error correction of the IMU, or some combination thereof.

Augmented-reality system 900 may also include a microphone array with a plurality of acoustic transducers 920(A)-920(J), referred to collectively as acoustic transducers 920. Acoustic transducers 920 may be transducers that detect air pressure variations induced by sound waves. Each acoustic transducer 920 may be configured to detect sound and convert the detected sound into an electronic format (e.g., an analog or digital format). The microphone array in FIG. 2 may include, for example, ten acoustic transducers: 920(A) and 920(B), which may be designed to be placed inside a corresponding ear of the user, acoustic transducers 920(C), 920(D), 920(E), 920(F), 920(G), and 920(H), which may be positioned at various locations on frame 910, and/or acoustic transducers 920(1) and 920(J), which may be positioned on a corresponding neckband 905.

In some embodiments, one or more of acoustic transducers 920(A)-(F) may be used as output transducers (e.g., speakers). For example, acoustic transducers 920(A) and/or 920(B) may be earbuds or any other suitable type of headphone or speaker.

The configuration of acoustic transducers 920 of the microphone array may vary. While augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by the controller 950 to process the collected audio information. In addition, the position of each acoustic transducer 920 of the microphone array may vary. For example, the position of an acoustic transducer 920 may include a defined position on the user, a defined coordinate on frame 910, an orientation associated with each acoustic transducer, or some combination thereof.

Acoustic transducers 920(A) and 920(B) may be positioned on different parts of the user's ear, such as behind the pinna or within the auricle or fossa. Or, there may be additional acoustic transducers on or surrounding the ear in addition to acoustic transducers 920 inside the ear canal. Having an acoustic transducer positioned next to an ear canal of a user may enable the microphone array to collect information on how sounds arrive at the ear canal. By positioning at least two of acoustic transducers 920 on either side of a user's head (e.g., as binaural microphones), augmented-reality device 900 may simulate binaural hearing and capture a 3D stereo sound field around about a user's head. In some embodiments, acoustic transducers 920(A) and 920(B) may be connected to augmented-reality system 900 via a wired connection 930, and in other embodiments, acoustic transducers 920(A) and 920(B) may be connected to augmented-reality system 900 via a wireless connection (e.g., a Bluetooth connection). In still other embodiments, acoustic transducers 920(A) and 920(B) may not be used at all in conjunction with augmented-reality system 900.

Acoustic transducers 920 on frame 910 may be positioned along the length of the temples, across the bridge, above or below display devices 915(A) and 915(B), or some combination thereof. Acoustic transducers 920 may be oriented such that the microphone array is able to detect sounds in a wide range of directions surrounding the user wearing the augmented-reality system 900. In some embodiments, an optimization process may be performed during manufacturing of augmented-reality system 900 to determine relative positioning of each acoustic transducer 920 in the microphone array.

In some examples, augmented-reality system 900 may include or be connected to an external device (e.g., a paired device), such as neckband 905. Neckband 905 generally represents any type or form of paired device. Thus, the following discussion of neckband 905 may also apply to various other paired devices, such as charging cases, smart watches, smart phones, wrist bands, other wearable devices, hand-held controllers, tablet computers, laptop computers and other external compute devices, etc.

As shown, neckband 905 may be coupled to eyewear device 902 via one or more connectors. The connectors may be wired or wireless and may include electrical and/or non-electrical (e.g., structural) components. In some cases, eyewear device 902 and neckband 905 may operate independently without any wired or wireless connection between them. While FIG. 9 illustrates the components of eyewear device 902 and neckband 905 in example locations on eyewear device 902 and neckband 905, the components may be located elsewhere and/or distributed differently on eyewear device 902 and/or neckband 905. In some embodiments, the components of eyewear device 902 and neckband 905 may be located on one or more additional peripheral devices paired with eyewear device 902, neckband 905, or some combination thereof.

Pairing external devices, such as neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 900 may be provided by a paired device or shared between a paired device and an eyewear device, thus reducing the weight, heat profile, and form factor of the eyewear device overall while still retaining desired functionality. For example, neckband 905 may allow components that would otherwise be included on an eyewear device to be included in neckband 905 since users may tolerate a heavier weight load on their shoulders than they would tolerate on their heads. Neckband 905 may also have a larger surface area over which to diffuse and disperse heat to the ambient environment. Thus, neckband 905 may allow for greater battery and computation capacity than might otherwise have been possible on a stand-alone eyewear device. Since weight carried in neckband 905 may be less invasive to a user than weight carried in eyewear device 902, a user may tolerate wearing a lighter eyewear device and carrying or wearing the paired device for greater lengths of time than a user would tolerate wearing a heavy standalone eyewear device, thereby enabling users to more fully incorporate artificial reality environments into their day-to-day activities.

Neckband 905 may be communicatively coupled with eyewear device 902 and/or to other devices. These other devices may provide certain functions (e.g., tracking, localizing, depth mapping, processing, storage, etc.) to augmented-reality system 900. In the embodiment of FIG. 9, neckband 905 may include two acoustic transducers (e.g., 920(1) and 920(J)) that are part of the microphone array (or potentially form their own microphone subarray). Neckband 905 may also include a controller 925 and a power source 935.

Acoustic transducers 920(1) and 920(J) of neckband 905 may be configured to detect sound and convert the detected sound into an electronic format (analog or digital). In the embodiment of FIG. 9, acoustic transducers 920(1) and 920(J) may be positioned on neckband 905, thereby increasing the distance between the neckband acoustic transducers 920(1) and 920(J) and other acoustic transducers 920 positioned on eyewear device 902. In some cases, increasing the distance between acoustic transducers 920 of the microphone array may improve the accuracy of beamforming performed via the microphone array. For example, if a sound is detected by acoustic transducers 920(C) and 920(D) and the distance between acoustic transducers 920(C) and 920(D) is greater than, e.g., the distance between acoustic transducers 920(D) and 920(E), the determined source location of the detected sound may be more accurate than if the sound had been detected by acoustic transducers 920(D) and 920(E).

Controller 925 of neckband 905 may process information generated by the sensors on 905 and/or augmented-reality system 900. For example, controller 925 may process information from the microphone array that describes sounds detected by the microphone array. For each detected sound, controller 925 may perform a direction-of-arrival (DOA) estimation to estimate a direction from which the detected sound arrived at the microphone array. As the microphone array detects sounds, controller 925 may populate an audio data set with the information. In embodiments in which augmented-reality system 900 includes an inertial measurement unit, controller 925 may compute all inertial and spatial calculations from the IMU located on eyewear device 902. A connector may convey information between augmented-reality system 900 and neckband 905 and between augmented-reality system 900 and controller 925. The information may be in the form of optical data, electrical data, wireless data, or any other transmittable data form. Moving the processing of information generated by augmented-reality system 900 to neckband 905 may reduce weight and heat in eyewear device 902, making it more comfortable to the user.

Power source 935 in neckband 905 may provide power to eyewear device 902 and/or to neckband 905. Power source 935 may include, without limitation, lithium ion batteries, lithium-polymer batteries, primary lithium batteries, alkaline batteries, or any other form of power storage. In some cases, power source 935 may be a wired power source. Including power source 935 on neckband 905 instead of on eyewear device 902 may help better distribute the weight and heat generated by power source 935.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1000 in FIG. 10, that mostly or completely covers a user's field of view. Virtual-reality system 1000 may include a front rigid body 1002 and a band 1004 shaped to fit around a user's head. Virtual-reality system 1000 may also include output audio transducers 1006(A) and 1006(B). Furthermore, while not shown in FIG. 10, front rigid body 1002 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1000 and/or virtual-reality system 1000 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 900 and/or virtual-reality system 1000 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 800, augmented-reality system 900, and/or virtual-reality system 1000 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 8 and 10, output audio transducers 808(A), 808(B), 1006(A), and 1006(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 810 may include condenser microphones, dynamic microphones, ribbon microphones, and/or any other type or form of input transducer. In some embodiments, a single transducer may be used for both audio input and audio output.

Figure 10:
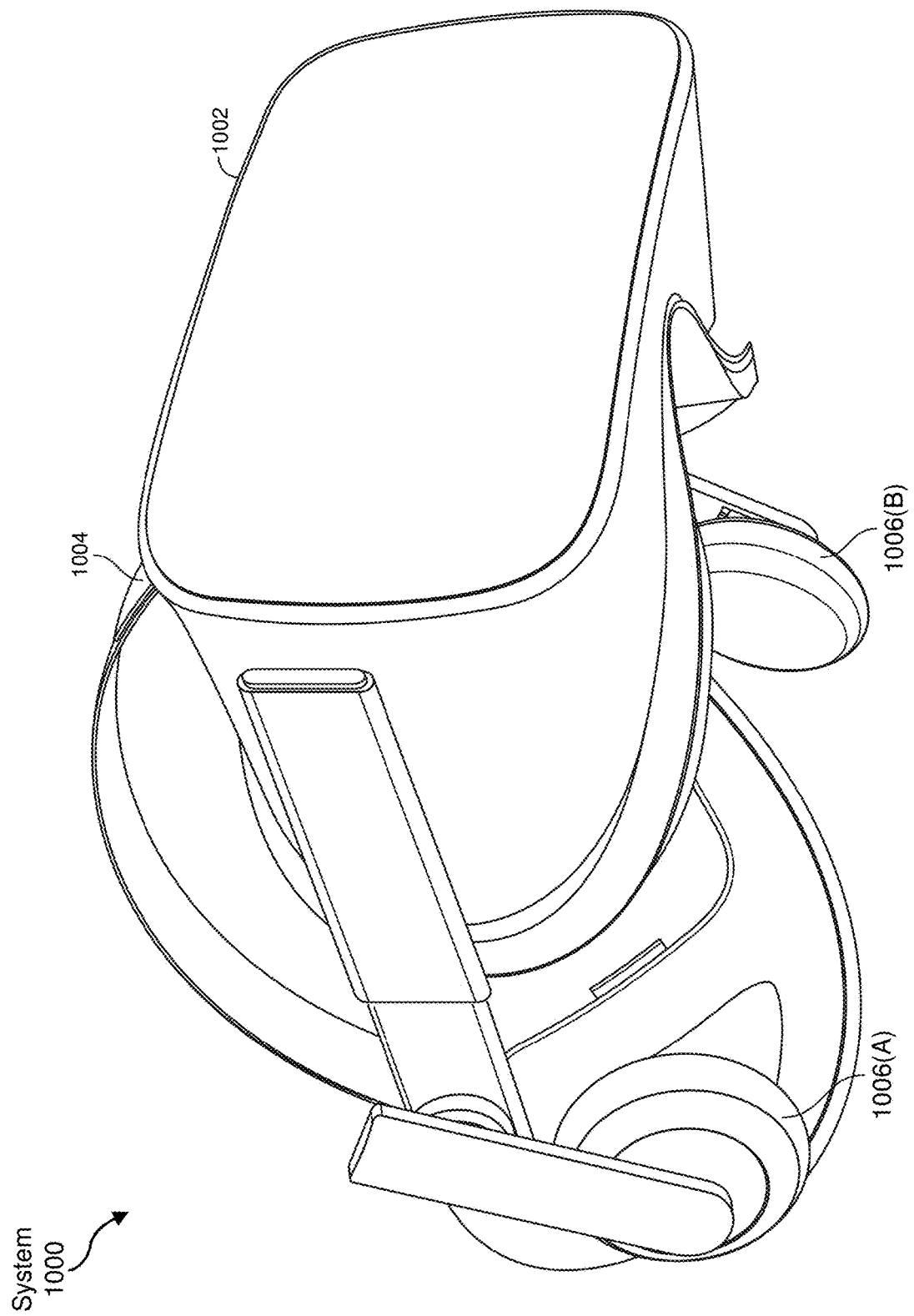
FIG. 10 is an illustration of an exemplary virtual-reality headset that may be used in connection with embodiments of this disclosure.

While not shown in FIGS. 8-10, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 800, 900, and 1000 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 11:
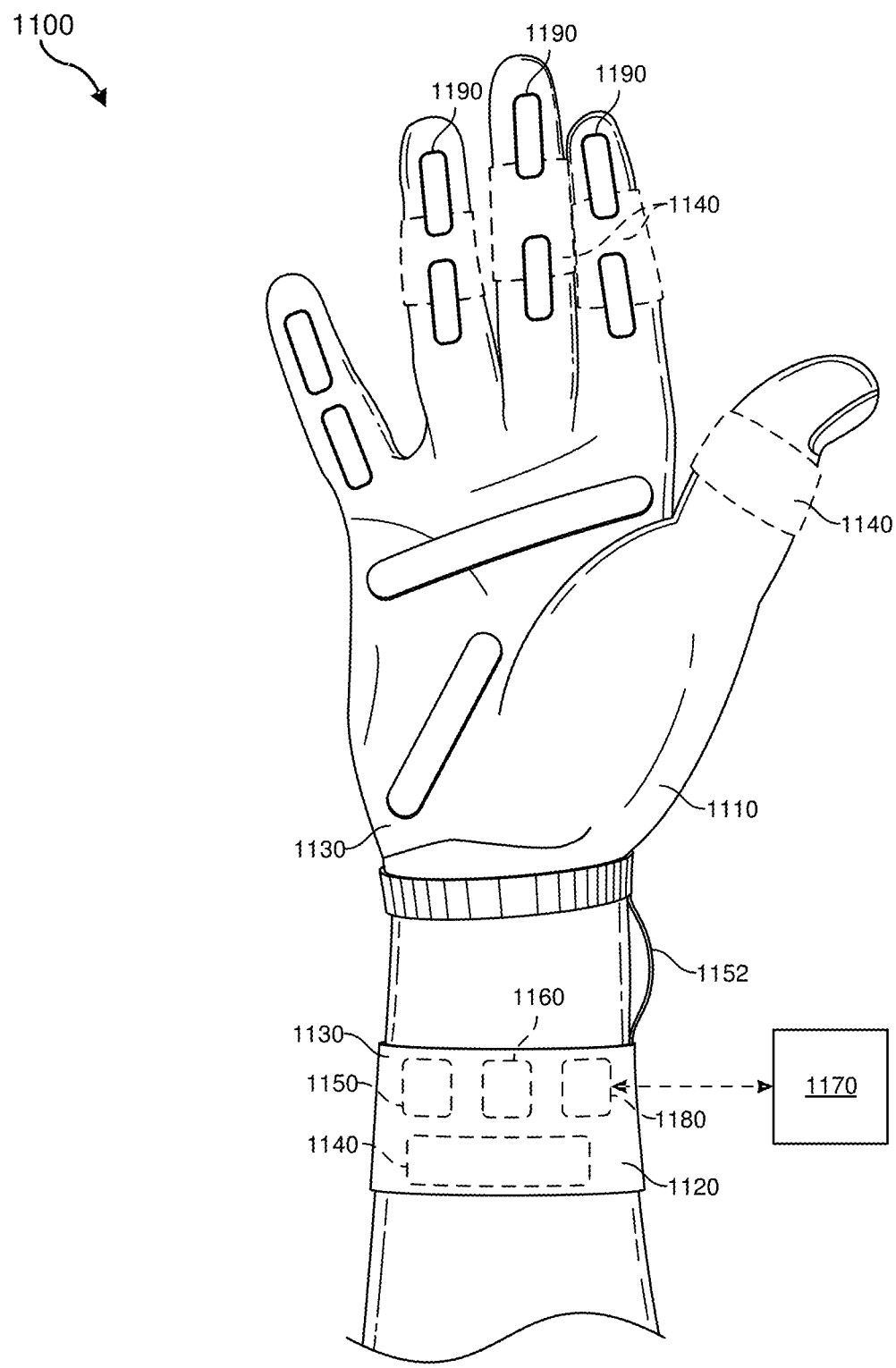
FIG. 11 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 11 illustrates a vibrotactile system 1100 in the form of a wearable glove (haptic device 1110) and wristband (haptic device 1120). Haptic device 1110 and haptic device 1120 are shown as examples of wearable devices that include a flexible, wearable textile material 1130 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1140 may be positioned at least partially within one or more corresponding pockets formed in textile material 1130 of vibrotactile system 1100. Vibrotactile devices 1140 may be positioned in locations to provide a vibrating sensation (e.g., haptic feedback) to a user of vibrotactile system 1100. For example, vibrotactile devices 1140 may be positioned to be against the user's finger(s), thumb, or wrist, as shown in FIG. 11. Vibrotactile devices 1140 may, in some examples, be sufficiently flexible to conform to or bend with the user's corresponding body part(s).

A power source 1150 (e.g., a battery) for applying a voltage to the vibrotactile devices 1140 for activation thereof may be electrically coupled to vibrotactile devices 1140, such as via conductive wiring 1152. In some examples, each of vibrotactile devices 1140 may be independently electrically coupled to power source 1150 for individual activation. In some embodiments, a processor 1160 may be operatively coupled to power source 1150 and configured (e.g., programmed) to control activation of vibrotactile devices 1140.

Vibrotactile system 1100 may be implemented in a variety of ways. In some examples, vibrotactile system 1100 may be a standalone system with integral subsystems and components for operation independent of other devices and systems. As another example, vibrotactile system 1100 may be configured for interaction with another device or system 1170. For example, vibrotactile system 1100 may, in some examples, include a communications interface 1180 for receiving and/or sending signals to the other device or system 1170. The other device or system 1170 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 1180 may enable communications between vibrotactile system 1100 and the other device or system 1170 via a wireless (e.g., Wi-Fi, Bluetooth, cellular, radio, etc.) link or a wired link. If present, communications interface 1180 may be in communication with processor 1160, such as to provide a signal to processor 1160 to activate or deactivate one or more of the vibrotactile devices 1140.

Vibrotactile system 1100 may optionally include other subsystems and components, such as touch-sensitive pads 1190, pressure sensors, motion sensors, position sensors, lighting elements, and/or user interface elements (e.g., an on/off button, a vibration control element, etc.). During use, vibrotactile devices 1140 may be configured to be activated for a variety of different reasons, such as in response to the user's interaction with user interface elements, a signal from the motion or position sensors, a signal from the touch-sensitive pads 1190, a signal from the pressure sensors, a signal from the other device or system 1170, etc.

Although power source 1150, processor 1160, and communications interface 1180 are illustrated in FIG. 11 as being positioned in haptic device 1120, the present disclosure is not so limited. For example, one or more of power source 1150, processor 1160, or communications interface 1180 may be positioned within haptic device 1110 or within another wearable textile.

Figure 12:
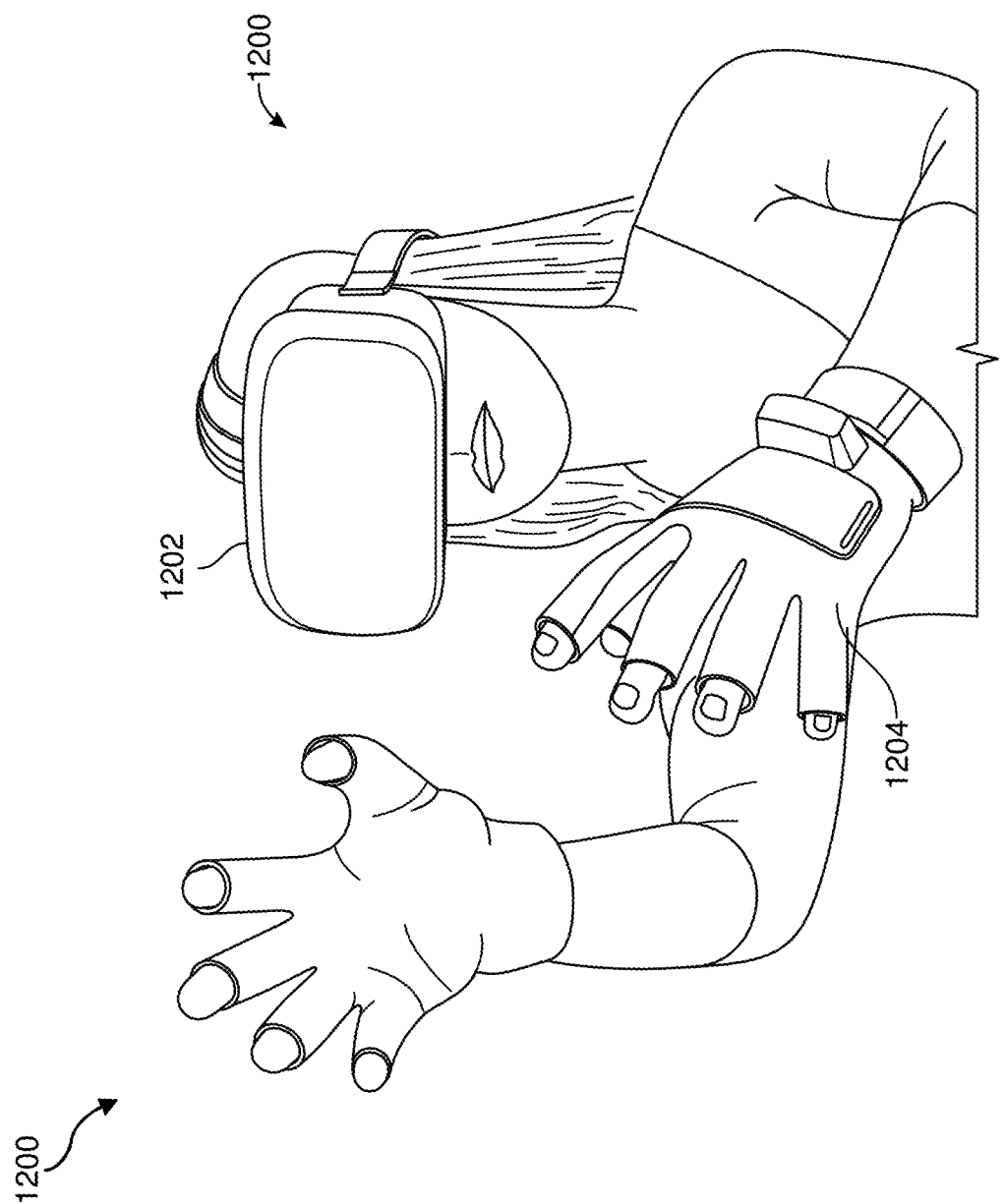
FIG. 12 is an illustration of an exemplary virtual-reality environment according to embodiments of this disclosure.

Haptic wearables, such as those shown in and described in connection with FIG. 11, may be implemented in a variety of types of artificial-reality systems and environments. FIG. 12 shows an example artificial reality environment 1200 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 1202 generally represents any type or form of virtual-reality system, such as virtual-reality system 1000 in FIG. 10. Haptic device 1204 generally represents any type or form of wearable device, worn by a use of an artificial reality system, that provides haptic feedback to the user to give the user the perception that he or she is physically engaging with a virtual object. In some embodiments, haptic device 1204 may provide haptic feedback by applying vibration, motion, and/or force to the user. For example, haptic device 1204 may limit or augment a user's movement. To give a specific example, haptic device 1204 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1204 to send action requests to a console. Examples of action requests include, without limitation, requests to start an application and/or end the application and/or requests to perform a particular action within the application.

Figure 13:
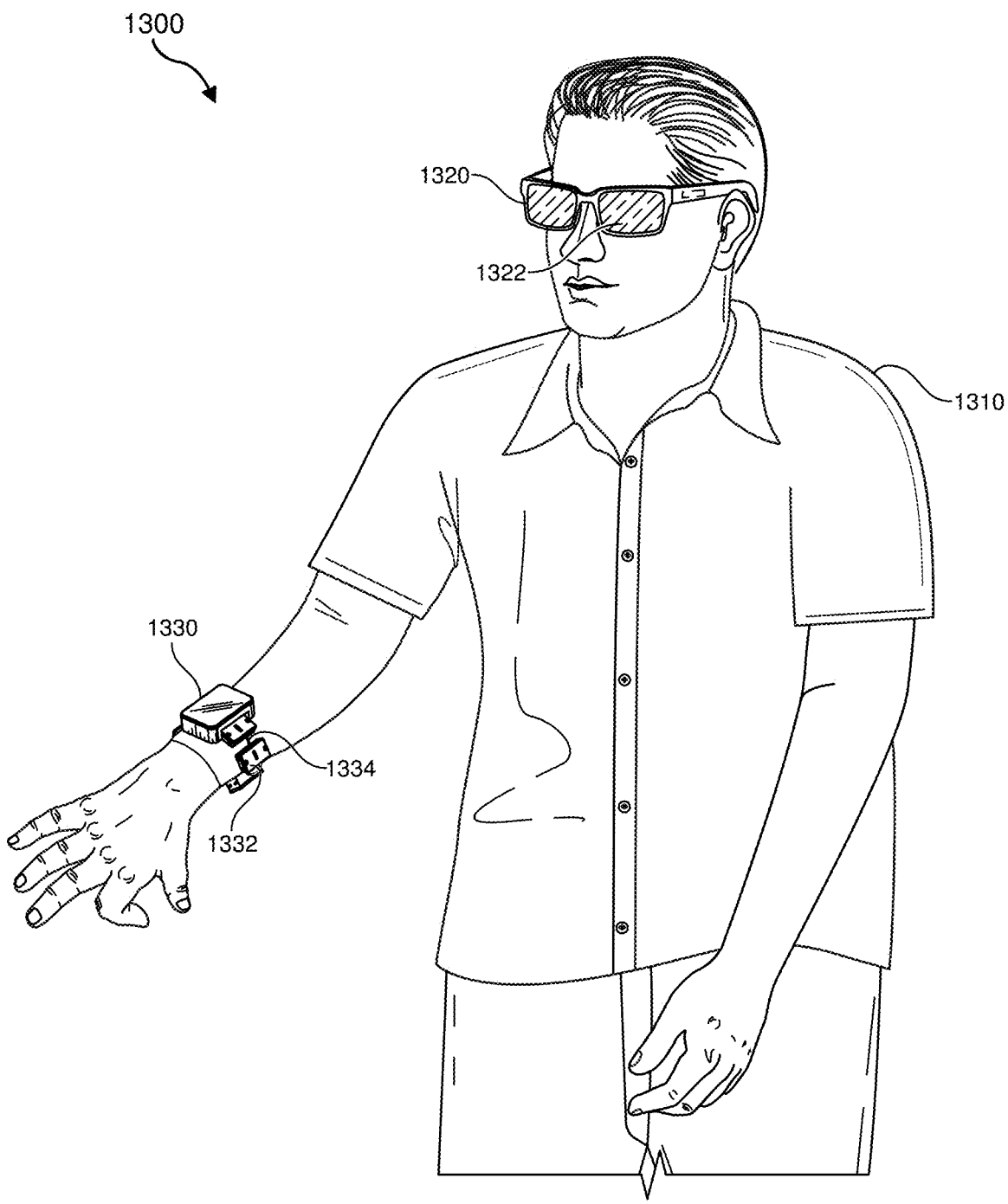
FIG. 13 is an illustration of an exemplary augmented-reality environment according to embodiments of this disclosure.

While haptic interfaces may be used with virtual-reality systems, as shown in FIG. 12, haptic interfaces may also be used with augmented-reality systems, as shown in FIG. 13. FIG. 13 is a perspective view a user 1310 interacting with an augmented-reality system 1300. In this example, user 1310 may wear a pair of augmented-reality glasses 1320 that have one or more displays 1322 and that are paired with a haptic device 1330. Haptic device 1330 may be a wristband that includes a plurality of band elements 1332 and a tensioning mechanism 1334 that connects band elements 1332 to one another.

One or more of band elements 1332 may include any type or form of actuator suitable for providing haptic feedback. For example, one or more of band elements 1332 may be configured to provide one or more of various types of cutaneous feedback, including vibration, force, traction, texture, and/or temperature. To provide such feedback, band elements 1332 may include one or more of various types of actuators. In one example, each of band elements 1332 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1110, 1120, 1204, and 1330 may include any suitable number and/or type of haptic transducer, sensor, and/or feedback mechanism. For example, haptic devices 1110, 1120, 1204, and 1330 may include one or more mechanical transducers, piezoelectric transducers, and/or fluidic transducers. Haptic devices 1110, 1120, 1204, and 1330 may also include various combinations of different types and forms of transducers that work together or independently to enhance a user's artificial-reality experience. In one example, each of band elements 1332 of haptic device 1330 may include a vibrotactor (e.g., a vibrotactile actuator) configured to vibrate in unison or independently to provide one or more of various types of haptic sensations to a user.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed, transform the data, output a result of the transformation to generate calibration data, use the result of the transformation to calibrate an electronic display, and store the result of the transformation in a data store. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

We claim:

1. A display calibration apparatus comprising:
   a lens;
   an actively-cooled electromagnetic radiation detector configured to detect electromagnetic radiation emitted from one or more pixels of an electronic display panel under test, wherein active cooling provided by the actively-cooled electromagnetic radiation detector is configured to reduce heat generated by the actively-cooled electromagnetic radiation detector, and wherein the electromagnetic radiation travels through the lens prior to reaching the detector; and
   a special-purpose computing device configured to:
      analyze the detected electromagnetic radiation from the one or more pixels of the electronic display panel; and
      generate calibration data for the electronic display panel using a specified calibration algorithm, such that the electronic display panel operates using the generated calibration data.

2. The display calibration apparatus of claim 1, wherein the actively-cooled electromagnetic radiation detector comprises an actively-cooled complementary metal-oxide-semiconductor (CMOS) detector.

3. The display calibration apparatus of claim 1, wherein:
the lens has one or more specified characteristics configured to increase accuracy of the calibration data including a specified minimum level of resolution; and
generation of the calibration data is dependent on the specified minimum level of resolution.

4. The display calibration apparatus of claim 1, wherein:
the lens has one or more specified characteristics configured to increase accuracy of the calibration data including a specified maximum level of distortion; and
generation of the calibration data is dependent on the specified maximum level of distortion.

5. The display calibration apparatus of claim 1, wherein:
the lens has one or more specified characteristics configured to increase accuracy of the calibration data including a specified maximum level of field curvature; and
generation of the calibration data is dependent on the specified maximum level of field curvature.

6. The display calibration apparatus of claim 1, wherein:
the lens has one or more specified characteristics configured to increase accuracy of the calibration data including a specified maximum level of chromatic aberration; and
generation of the calibration data is dependent on the specified maximum level of chromatic aberration.

7. The display calibration apparatus of claim 1, wherein an aspect ratio associated with the lens matches an aspect ratio associated with the display panel.

8. The display calibration apparatus of claim 1, wherein the lens and electromagnetic radiation detector are configured to match one or more characteristics of the specified calibration algorithm.

9. The display calibration apparatus of claim 1, wherein the step of analyzing the detected electromagnetic radiation from the one or more pixels of the electronic display panel performed by the special-purpose computing device is performed in parallel by a plurality of special-purpose computing devices.

10. The display calibration apparatus of claim 1, wherein the step of generating calibration values for the electronic display panel using a specified calibration algorithm is performed in parallel by a plurality of special-purpose computing devices.

11. A computer-implemented method, comprising:
detecting, at an actively-cooled electromagnetic radiation detector, electromagnetic radiation emitted from one or more pixels of an electronic display under test, the electromagnetic radiation traveling through at least one lens prior to reaching the detector, wherein active cooling provided by the actively-cooled electromagnetic radiation detector is configured to reduce heat generated by the actively-cooled electromagnetic radiation detector, and;
analyzing the electromagnetic radiation detected by the actively-cooled electromagnetic radiation detector;
generating calibration data for the electronic display panel using a specified calibration algorithm; and
controlling the electronic display panel using the generated calibration data.

12. The computer-implemented method of claim 11, wherein electromagnetic radiation detected from one or more different electronic display panels is analyzed while the calibration data are being generated.

13. The computer-implemented method of claim 11, wherein the calibration data for the electronic display are generated in parallel.

14. The computer-implemented method of claim 13, wherein the parallel generation of calibration data allows an increased exposure time by the electromagnetic radiation detector.

15. The computer-implemented method of claim 11, wherein the electromagnetic radiation detector includes at least a plurality of detecting pixels for each pixel of the display panel.

16. The computer-implemented method of claim 11, wherein a sensor area on the electromagnetic radiation detector is aligned with an aspect ratio of the electronic display panel.

17. The computer-implemented method of claim 11, wherein analyzing one or more portions of electromagnetic radiation detected by an actively-cooled electromagnetic radiation detector includes identifying one or more centroids in the electronic display panel.

18. The computer-implemented method of claim 17, wherein the step of identifying one or more centroids in the electronic display panel is parallelized across two or more special-purpose computing systems.

19. The computer-implemented method of claim 18, wherein an amount of exposure time associated with the detection of electromagnetic radiation emitted from the one or more pixels of the electronic display panel under test is reduced or increased based on the number of parallelized special-purpose computing systems.

20. A system comprising:
a lens;
an actively-cooled electromagnetic radiation detector configured to detect electromagnetic radiation emitted from one or more pixels of an electronic display panel under test, wherein the electromagnetic radiation travels through the lens prior to reaching the detector, and wherein active cooling provided by the actively-cooled electromagnetic radiation detector is configured to reduce heat generated by the actively-cooled electromagnetic radiation detector, and;
at least one physical processor; and
physical memory comprising computer-executable instructions that, when executed by the physical processor, cause the physical processor to:
analyze the detected electromagnetic radiation from the one or more pixels of the electronic display panel; and
generate calibration data for the electronic display panel using a specified calibration algorithm, such that the electronic display panel operates using the generated calibration data.

* * * * *